(12) United States Patent
Pang et al.

(10) Patent No.: US 7,173,371 B2
(45) Date of Patent: Feb. 6, 2007

(54) TRANSMISSIVE-TYPE ORGANIC ELECTROLUMINESCENT DISPLAY DEVICE AND FABRICATING METHOD OF THE SAME

(75) Inventors: Hee-Sok Pang, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/665,369

(22) Filed: Sep. 22, 2003

(65) Prior Publication Data
US 2004/0113545 A1 Jun. 17, 2004

(30) Foreign Application Priority Data
Sep. 19, 2002 (KR) ...................... 10-2002-0057421

(51) Int. Cl.
H01J 1/66 (2006.01)
H01J 1/72 (2006.01)
H01J 1/98 (2006.01)
H01J 9/227 (2006.01)
H01J 9/00 (2006.01)
H01J 9/24 (2006.01)

(52) U.S. Cl. .................. 313/504; 313/311; 445/24
(58) Field of Classification Search ................ 313/503, 313/504, 499, 292; 445/46, 58, 56
See application file for complete search history.

(56) References Cited
U.S. PATENT DOCUMENTS 3,622,829 A * 11/1971 Watanabe .................... 313/491
6,107,736 A * 8/2000 Shi et al. ..................... 313/509
6,344,712 B1 * 2/2002 Eida et al. ................... 313/504
6,469,439 B2 * 10/2002 Himeshima et al. ........ 313/506
2002/0011783 A1 * 1/2002 Hosokawa ................... 313/504
2002/0109456 A1 * 8/2002 Morii et al. ................. 313/504
2003/0011305 A1 * 1/2003 Himeshima et al. ........ 313/506

FOREIGN PATENT DOCUMENTS

| JP | 2001-176670 | 6/2001 |
| JP | 2001-279134 | 10/2001 |
| KR | 2001-0012097 | 2/2001 |

* cited by examiner

Primary Examiner—Mariceli Santiago
Assistant Examiner—Elizabeth Rielley
(74) Attorney, Agent, or Firm—Morgan, Lewis & Bockius, LLP

(57) ABSTRACT

A transmissive-type organic electroluminescent display device includes a substrate including sub-pixel regions thereon, an array element in each sub-pixel area that includes thin film transistors, a partition wall at a border portion between adjacent sub-pixel regions made of a transparent insulating material, a first electrode made of a transparent conductive material in each sub-pixel region between adjacent partition walls, an organic electroluminescent layer on the first electrode in each sub-pixel region between the adjacent partition walls, a second electrode made of a transparent conductive material on the organic electroluminescent layer and a passivation layer covering the second electrode.

19 Claims, 9 Drawing Sheets sub pixel   210          212

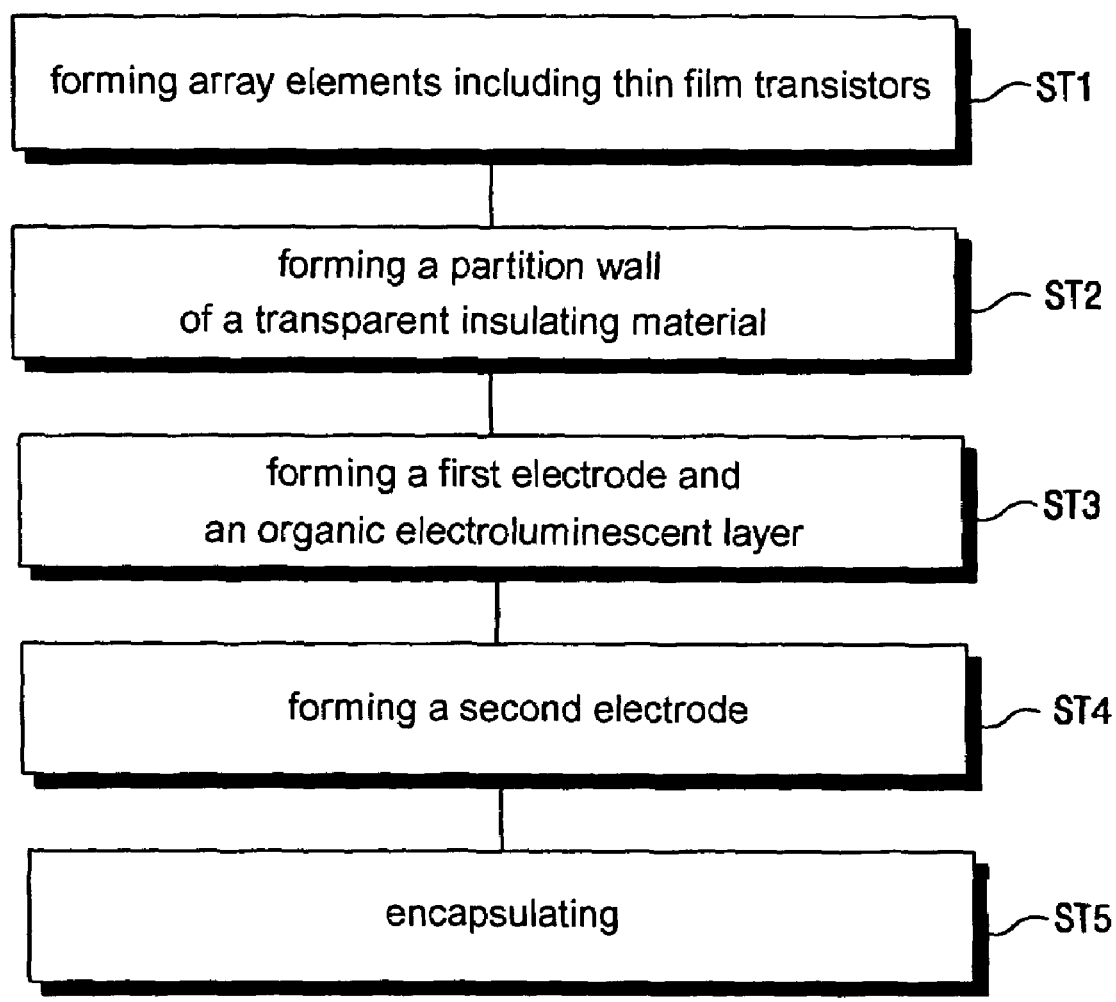

TRANSMISSIVE-TYPE ORGANIC ELECTROLUMINESCENT DISPLAY DEVICE AND FABRICATING METHOD OF THE SAME

The present application claims the benefit of Korean Patent Application No. 2002-57421 filed in Korea on Sep. 19, 2002, which is hereby incorporated by reference.

BACKGROUND OF THE INVENTION

1. Field of the Invention

The present invention relates to an organic electroluminescent display device, and more particularly, to a transmissive-type organic electroluminescent display device and a fabricating method of the same.

2. Discussion of the Related Art

Among flat panel displays, liquid crystal display (LCD) devices have been commonly used due to their thin profile, light weight, and low power consumption. However, the LCD devices are not self-luminescent and thus have low brightness. Further, LCD devices typically have a low contrast ratio and narrow viewing angle. Furthermore, LCD devices can have large overall size because of the need to use a backlight.

Organic electroluminescent display (OELD) devices have wide viewing angles and excellent contrast ratios because of their self-luminescence. Since the OELD devices do not require additional light sources, such as a backlight, the OELD devices have relatively small size, are light weight, and have low power consumption, as compared to LCD devices. OELD devices can be driven by low voltage direct current (DC) and have short response times on the order of microseconds. Since the OELD devices are solid phase devices, OELD devices can sufficiently withstand external impacts and have greater operational temperature ranges. In addition, the OELD devices can be manufactured at low cost since only deposition and encapsulation apparatus are necessary for manufacturing the OELD devices, thereby simplifying manufacturing processes.

OELD devices can be categorized as passive matrix-type OELD devices or active matrix-type OELD devices depending upon the method of driving the devices. The passive matrix-type OELD devices are commonly used due to their simplicity and ease of fabrication. However, the passive matrix-type OELD devices have scanning lines and signal lines that perpendicularly cross each other in a matrix configuration. Since a scanning voltage is sequentially supplied to the scanning lines to operate each pixel, an instantaneous brightness of each pixel during a selection period should reach a value resulting from multiplying an average brightness by the number of the scanning lines to obtain a required average brightness. Accordingly, as the number of the scanning lines increases, the applied voltage and current also increase. Thus, the passive matrix-type OELD devices are not adequate for high resolution and large-sized display since the device easily deteriorates during use and the power consumption is high.

Since the passive matrix-type OELD devices have many disadvantages, such as low image resolution, high power consumption and short operational lifetime, the active matrix-type OELD device has been developed to produce high resolution images in large display area displays. In the active matrix-type OELD devices, thin film transistors (TFTs) are disposed at each sub-pixel for use as a switching element to turn each sub-pixel ON and OFF. A first electrode in the sub-pixel connected to the TFT is turned ON/OFF while a second electrode facing the first electrode functions as a common electrode. In addition, a voltage supplied to the sub-pixel is stored in a storage capacitor, thereby maintaining the voltage for driving the device until a voltage of next frame is supplied, regardless of the number of the scanning lines. As a result, since an equivalent brightness is obtained with a low applied current, an active matrix-type OELD device has low power consumption and high image resolution over a large area.

FIG. 1 is a schematic circuit diagram of a pixel structure of an active matrix-type OELD device according to the related art. In FIG. 1, a scanning line 1 is arranged along a first direction, and a signal line 2 and a power supply line 3 that are spaced apart from each other are arranged along a second direction perpendicular to the first direction. The signal line 2 and the power supply line 3 crosse the scanning line 1 to thereby define a pixel area. A switching thin film transistor (TFT) $T_S$, as an addressing element, is connected to the scanning line 1 and the signal line 2. A storage capacitor $C_{ST}$ is connected to the switching TFT $T_S$ and the power supply line 3. A driving thin film transistor (TFT) $T_D$, as a current source element, is connected to the storage capacitor $C_{ST}$ and the power supply line 3. An organic electroluminescent (EL) diode $D_{EL}$ is connected to the driving TFT $T_D$.

When a forward current is supplied to the organic EL diode $D_{EL}$, an electron and a hole are recombined to generate electron-hole pairs at the PN junction of the organic EL diode $D_{EL}$ between an anode, which provides holes, and a cathode, which provides electrons. There is an energy difference between the electron-hole pair and the separated electron and hole. More particularly, the electron-hole pair has a lower energy than the separated electron and hole. The energy difference generates the emission of light.

The OELD devices are commonly categorized as top emission-type and bottom emission-type according to the direction of the emitted light. In the bottom emission-type OELD device, light is emitted from the bottom of the device through a bottom substrate including thin film transistors. However, the emitted light does not pass through electrode lines and the thin film transistors on the array substrate. Therefore, the aperture ratio of the bottom emission-type OELD device depends on the structure of the thin film transistors and the electrode lines. It is not easy to design the thin film transistors and electrode lines that minimally block light. In the top emission-type OELD device, light is emitted out the top of the device through a top substrate. The emission area for the top substrate of the top emission-type OELD device can reach about 70% to about 80% of the whole panel size. However, the air easily infiltrates the organic electroluminescent layer in the top emission-type OELD device.

To solve the problems of the top emission-type and the bottom emission-type OELD devices, which each have only one emission direction, an OELD device that emits light in both the upward and downward directions has been recently developed. FIG. 2 is a cross-sectional view of such a transmissive-type organic electroluminescent display (OELD) device according to the related art. As shown in FIG. 2, a gate electrode 12 is formed on a substrate 10 in a sub-pixel region Psub, which are the minimum constituent unit for a displayed image. A gate insulating layer 14 is formed over the entire surface of the substrate 10 and covering the gate electrode 12. A semiconductor layer 16 is formed on the gate insulating layer 14 and over the gate electrode 12. A source electrode 18 and a drain electrode 20 are formed on the semiconductor layer 16 and spacing apart from each other. A power supply line 22 is formed on the gate insulating layer 14 and connected to the source electrode 18.

A first passivation layer 26 is formed over the entire surface of the substrate 10 that includes the source electrode 18, the drain electrode 20 and the power supply line 22. The first passivation layer 26 includes a drain contact hole 24 for exposing the drain electrode 20. A first electrode 28 is formed on the first passivation layer 26 and is connected to the drain electrode 20 through the drain contact hole 24. An organic electroluminescent layer 30 and a second electrode 32 are sequentially formed over the entire surface of the substrate 10 to cover the first electrode 28. A second passivation layer 34 is formed on the second electrode 32. The second passivation layer 34 protects both the second electrode 32 and the organic electroluminescent display device from external impacts, moisture and the like.

The first electrode 28, the second electrode 32 and the organic electroluminescent layer 30 interposed between the first and second electrodes 28 and 32 constitute an organic electroluminescent (EL) diode. The gate electrode 12, the semiconductor layer 16, the source electrode 18 and the drain electrode 20 constitute a driving thin film transistor (TFT), which supplies currents to the organic EL diode. Although not shown in FIG. 2, a storage capacitor is connected to the power supply line 22. Further, the gate electrode 12 of the driving TFT is connected to a drain electrode of a switching TFT (not shown).

If the first electrode 28 and the second electrode 32 function as an anode electrode and a cathode electrode, respectively, the first electrode 28 may be formed of a transparent conductive material, such as indium tin oxide. The second electrode 32 may be a double layer including a metallic thin film, which has a low work function, that contacts the organic EL layer 30. The organic EL layer 30 is formed by an evaporation method using a low molecular material. The first electrode 28 is formed at each sub-pixel through a patterning process using a shadow mask.

The transmissive-type OELD device according to the relate art is difficult and inefficient to manufacture as a large display panel when the organic EL layer of low molecular material is formed by an evaporation method. In addition, the shadow mask process requires an additional processing apparatus that may damage the device. Further, the shadow mask process becomes more difficult as the resolution for a device is increased. In addition, the related art transmissive-type OELD device has poor transmissive characteristics due to lack of consideration for transmissive characteristics of array elements in a non-emissive area.

SUMMARY OF THE INVENTION

Accordingly, the present invention is directed to a transmissive-type organic electroluminescent device and a fabricating method of the same that substantially obviate one or more of the problems due to limitations and disadvantages of the related art.

An object of the present invention is to provide a transmissive-type organic electroluminescent device having improved transmittance and a large size.

Another object of the present invention is to provide a fabricating method of a transmissive-type organic electroluminescent device having simplified manufacturing process.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a transmissive-type organic electroluminescent display device includes a substrate including sub-pixel regions thereon, an array element in each sub-pixel area that includes thin film transistors, a partition wall at a border portion between adjacent sub-pixel regions made of a transparent insulating material, a first electrode made of a transparent conductive material in each sub-pixel region between adjacent partition walls, an organic electroluminescent layer on the first electrode in each sub-pixel region between the adjacent partition walls, a second electrode made of a transparent conductive material on the organic electroluminescent layer and a passivation layer covering the second electrode.

In another aspect, a transmissive-type organic electroluminescent display device includes a substrate including sub-pixel regions, a first electrode made of a first transparent conductive material, a partition wall made of a transparent insulating material at a border portion between adjacent sub-pixel regions, an organic electroluminescent layer in each sub-pixel region between adjacent partition walls and a second electrode made of a second transparent conductive material on the organic electroluminescent layer between the adjacent partition walls.

In another aspect, a method of fabricating a transmissive-type organic electroluminescent device includes: forming array elements having thin film transistors in sub-pixel regions of a substrate; forming a partition wall at a border portion between adjacent sub-pixel regions, the partition wall being made of a transparent insulating material; forming a first electrode in each sub-pixel region between adjacent partition walls, the first electrode being made of a first transparent conductive material; forming an organic electroluminescent layer on the first electrode between the adjacent partition walls, the organic electroluminescent layer being made of a high molecular material; forming a second electrode on the entire substrate including the organic electroluminescent layer, the second electrode being made of a second transparent conductive material; and encapsulating the substrate including the second electrode by forming a passivation layer thereon.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

FIG. 9 is a flow chart of a fabricating process of a transmissive-type organic electroluminescent display device according to embodiments of the present invention.

DETAILED DESCRIPTION OF THE PREFERRED EMBODIMENTS

Reference will now be made in detail to the illustrated embodiments of the present invention, an example of which is illustrated in the accompanying drawings.

Figure 1:
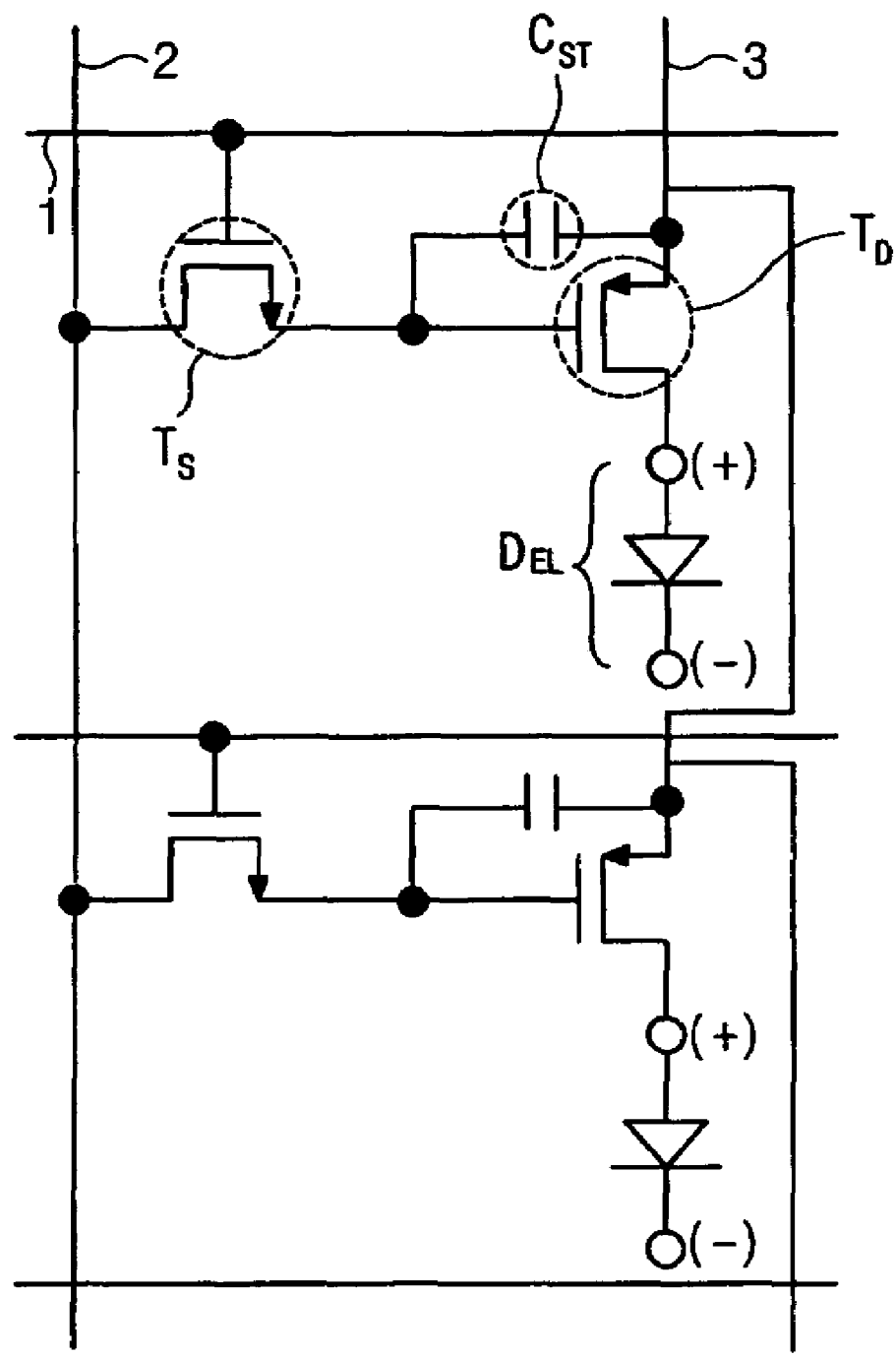
FIG. 1 is a schematic circuit diagram of a pixel structure of an active matrix-type organic electro-luminescent display (OELD) device according to the related art.
Figure 2:
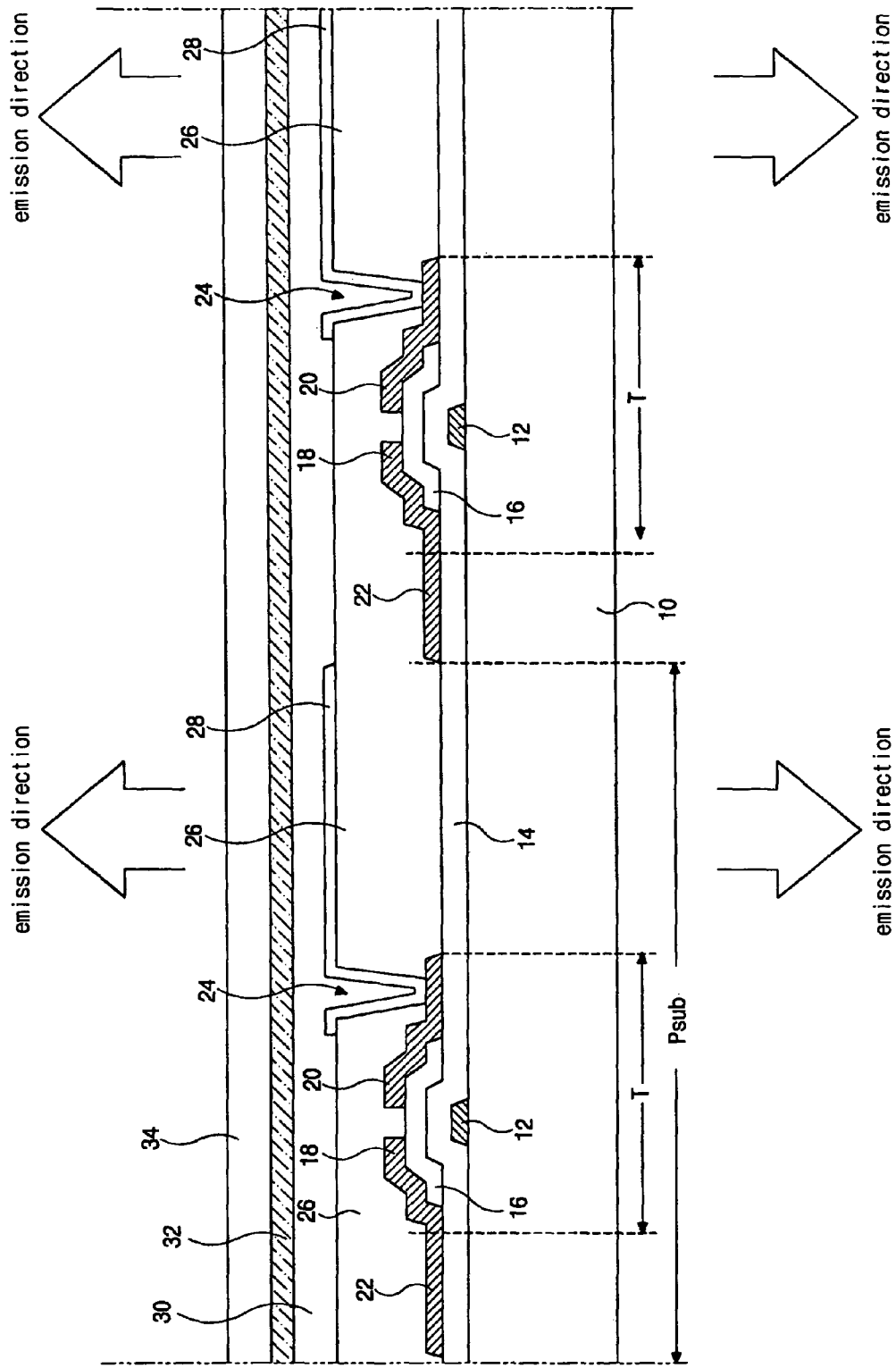
FIG. 2 is a cross-sectional view of a transmissive-type organic electroluminescent display (OELD) device according to the related art.
Figure 3:
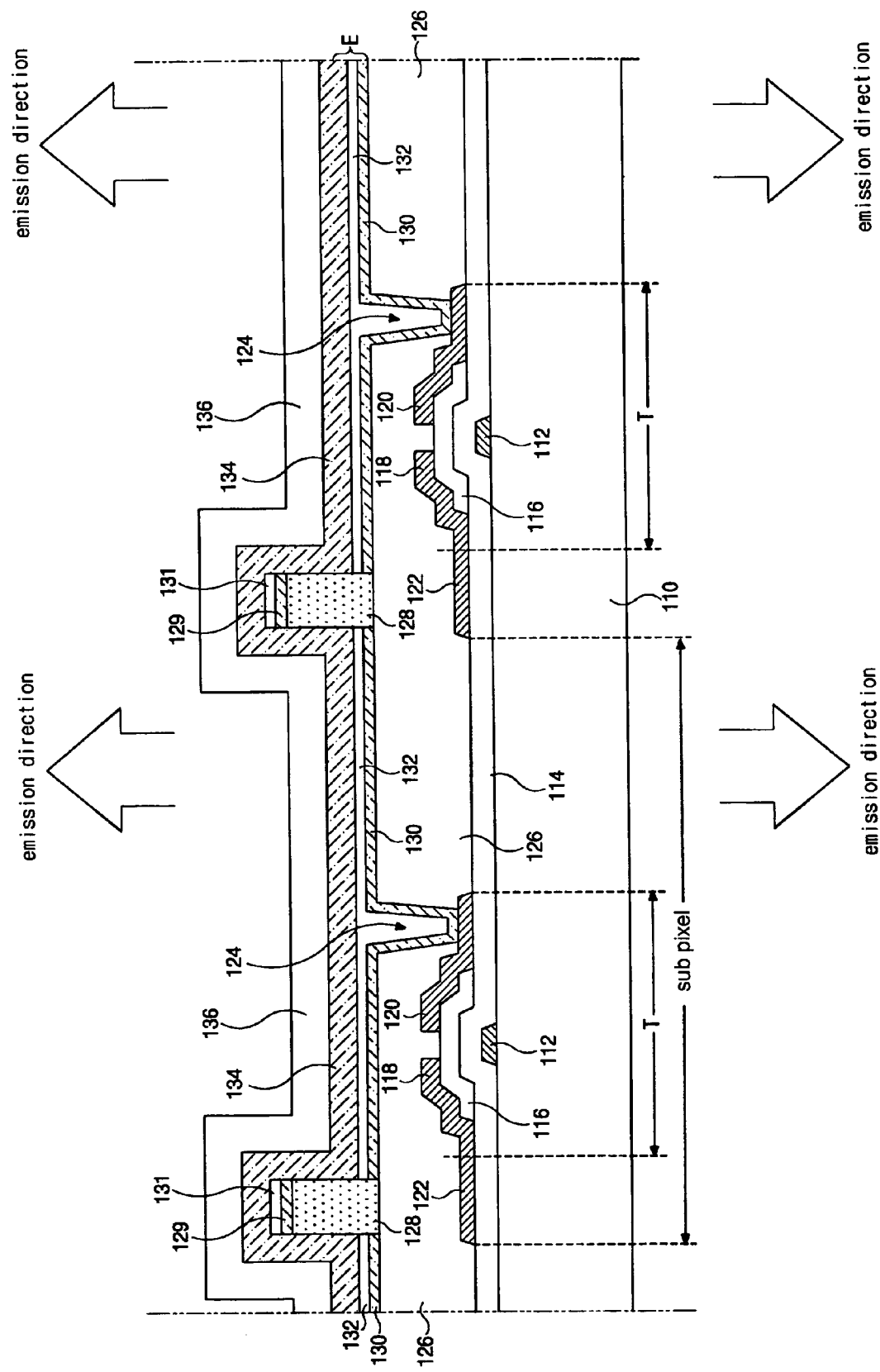
FIG. 3 is a cross-sectional view of a transmissive organic electroluminescent display (OELD) device according to embodiments of the present invention.

FIG. 3 is a cross-sectional view of a transmissive organic electroluminescent display (OELD) device according to embodiments of the present invention. As shown in FIG. 3, a gate electrode 112 is formed over a substrate 110 in each sub pixel. A gate insulating layer 114 is formed over the entire surface of the substrate 110 to cover the gate electrode 112. A semiconductor layer 116 is formed on the gate insulating layer 114 and over the gate electrode 112. A source electrode 118 and a drain electrode 120 are formed on the semiconductor layer 116 and spaced apart from each other. A power supply line 122 connected to the source electrode 118 is formed on the gate insulating layer 114.

A first passivation layer 126 is formed over the entire surface of the substrate 110 to cover the source electrode 118, the drain electrode 120 and the power supply line 122. The first passivation layer 126 has a drain contact hole 124 exposing the drain electrode 120. A partition wall 128 is formed on the first passivation layer 126 over the power supply line 122. A first electrode 130 and an organic EL layer 132 are subsequently formed on the first passivation layer 126 at each sub pixel. The first electrode 130 and organic EL layer 132 are separated without a patterning process due to the partition wall 128. The first electrode 130 is connected to the drain electrode 120 through the drain contact hole 124. A second electrode 134 and a second passivation layer 136 are sequentially formed over the entire surface of the substrate 110 to cover the partition wall 128 and the organic EL layer 132.

The first electrode 130, the second electrode 134 and the organic EL layer 132 interposed between the first and second electrodes 130 and 134 constitute an organic EL diode, and the gate electrode 112, the semiconductor layer 116, the source electrode 118 and the drain electrode 120 form a thin film transistor (TFT), which corresponds to a driving TFT for supplying the organic EL diode with currents.

The first and second electrodes 130 and 134 are made of a transparent conductive material that efficiently transmits light. The transparent conductive material may be selected from materials including indium tin oxide, indium zinc oxide and indium tin zinc oxide. For example, if the first electrode 130 and the second electrode 134 function as an anode electrode and a cathode electrode, respectively, the second electrode 134, preferably, may further include a metallic thin film of about 1,000 Å, which has a low work function below about 4 eV, that contacts the organic EL layer 132. The metallic thin film may be formed of one of aluminum (Al), calcium (Ca), lithium fluoride (LiF), and alkali metals, for example. Therefore, the second electrode 134 may be a double layer that includes the metallic thin film.

The organic EL layer 132 may be made of a high molecular material. If the first and second electrodes 130 and 134 act as the anode electrode and the cathode electrode, respectively, the organic EL layer 132 may include in order a hole injecting layer, a hole transporting layer, an emissive layer, an electron transporting layer, and an electron injecting layer, wherein the hole injecting layer contacts the first electrode 130 and the electron injecting layer contacts the second electrode 134. In addition, when the first electrode 130 and the organic EL layer 132 are formed, a first electrode material layer 129 and an organic EL material layer 131 may be also formed on the partition wall 128 at the same time.

The organic EL layer 132 may be formed by one of an ink jet method, a roll coating method and a nozzle coating method, for example. In the ink jet method, the organic EL layer 132 may be formed by a dotting method such that the organic EL layer 132 has a circular shape. Thus, an opening enclosed by the partition wall 128 preferably has a circular shape so as to form a sub-pixel having a circular shape. In the roll coating method, since the organic EL layer 132 may be formed by coating the substrate along a single direction, the partition wall 128 may be formed in a single direction corresponding to the power supply line or the data line. On the other hand, in the nozzle coating method, the shape of the partition wall 128 is not limited. The partition wall 128 may have a thickness within a range of about 1 μm to about 8 μm, and more preferably, within a range of about 4 μm to 5 μm.

A partition wall is formed of a photoresist through a photolithography process. However, the photoresist has a color after the exposing step that does not have the desired light transmissive characteristics. To improve transmissive characteristics for both sides of the transmissive-type OELD device according to embodiments of the present invention, the partition wall 128 may be made of an insulating material having high light transmittance, such as an organic material. The transmissive-type OELD device may act as a glass window or a display device depending on applied fields. Accordingly, since elements of the transmissive-type OELD device have high transmissive characteristics, the partition wall may also be preferably made of an insulating material that efficiently transmits light. Additionally, the substrate 110 is a transparent insulating substrate. The substrate 110 may be made of a glass substrate or may be made of a flexible substrate, such as plastic.

Figure 4:
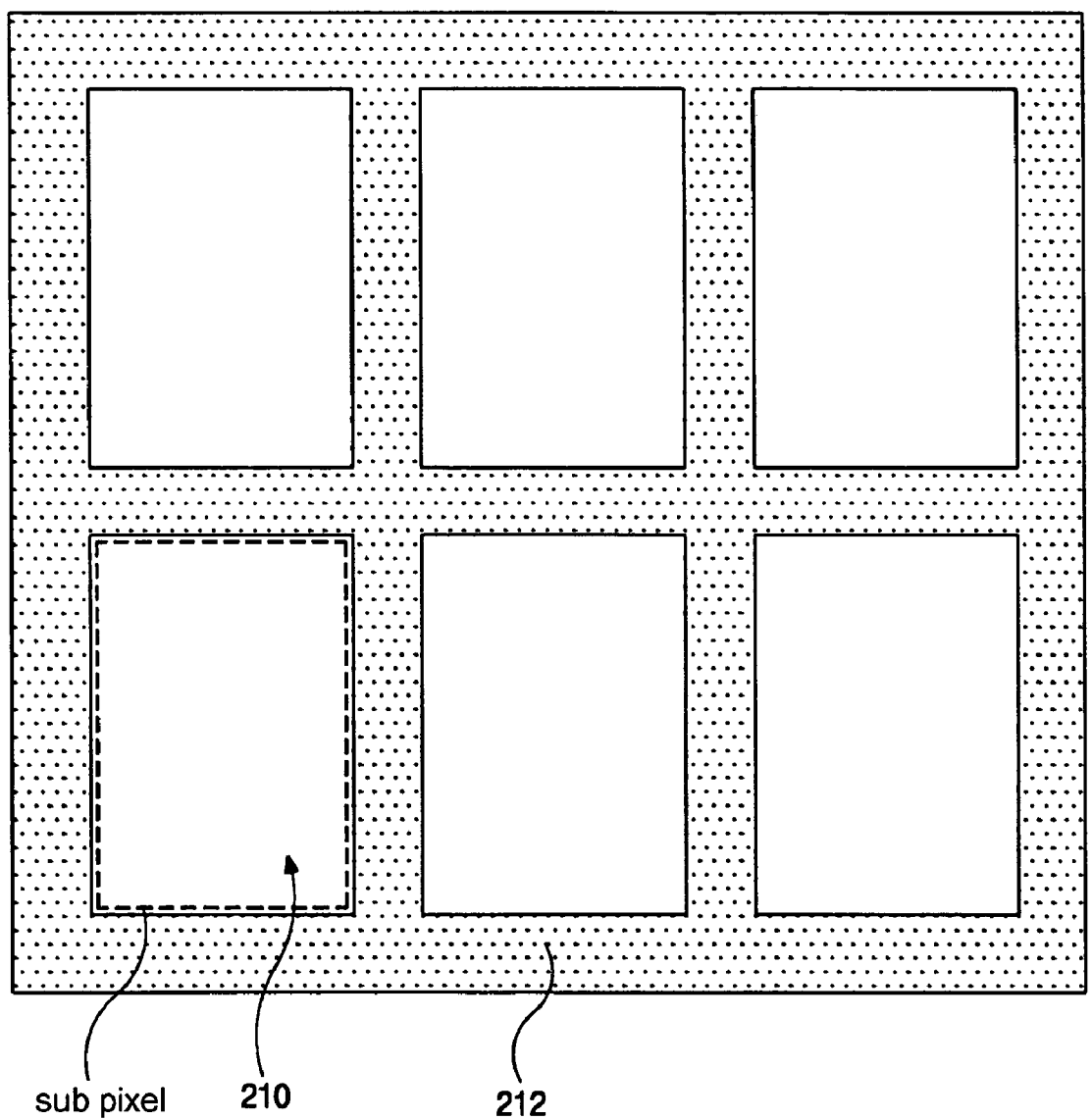
FIG. 4 is a schematic plan view of a partition wall of a transmissive-type OELD device according to a first embodiment of the present invention.

FIG. 4 is a schematic plan view of a partition wall of a transmissive-type OELD device according to a first embodiment of the present invention showing several sub pixels. As shown in FIG. 4, a partition wall 212 forms openings 210, which correspond to the sub-pixels, is formed to enclose each sub-pixel region. The partition wall 212 may be formed of an organic material by using the nozzle coating method.

Although not shown in the FIG. 4, in each opening 210, a first electrode and an organic EL layer are sequentially formed in each sub-pixel. The first electrode and the organic EL layer of adjacent openings 210 are separated due to the partition wall 212 without a patterning process. Since the partition wall 212 may be formed of a transparent material, transmissive characteristics of the transmissive-type OELD device can be increased.

Figure 5:
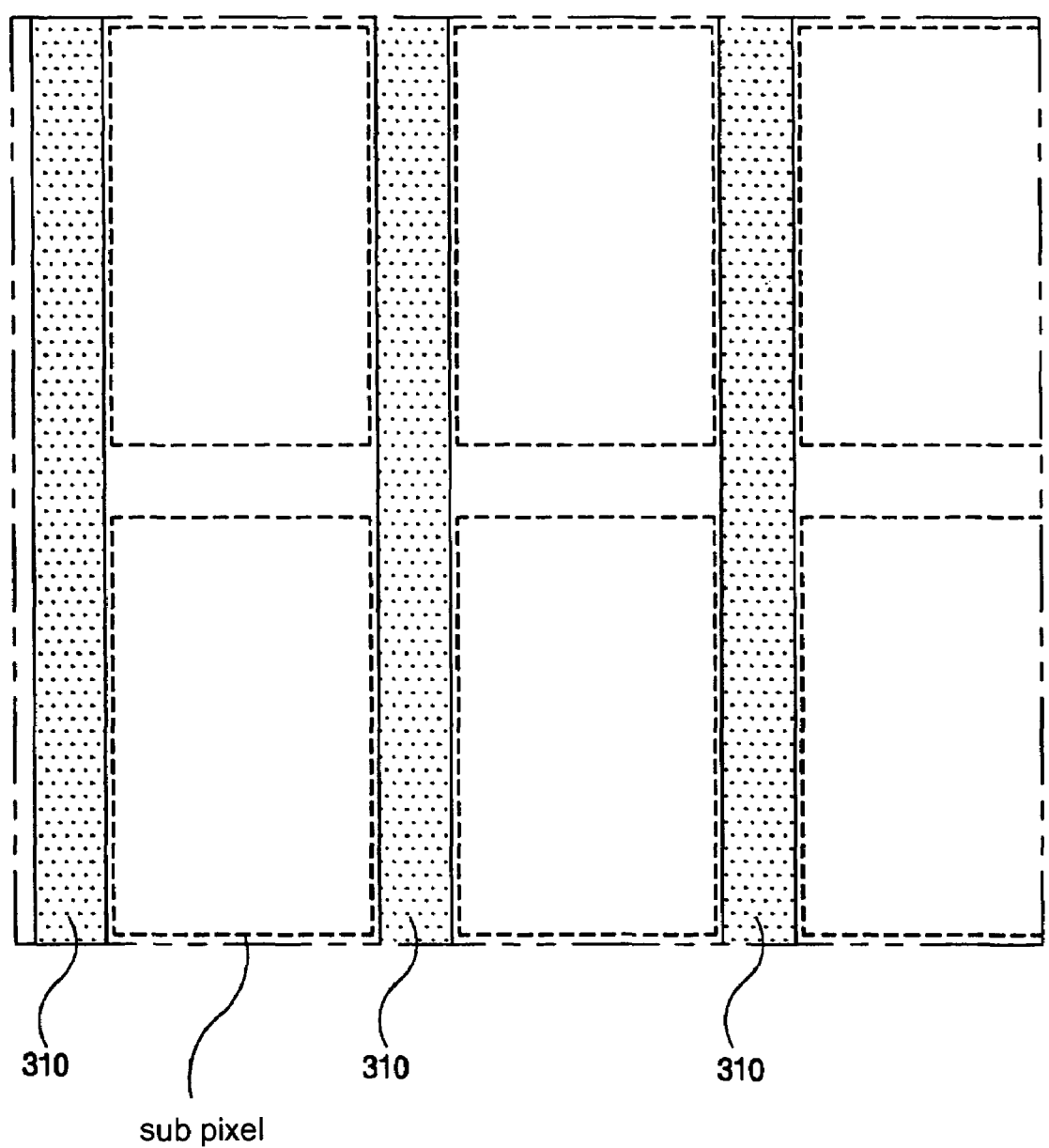
FIG. 5 is a schematic plan view of a partition wall for a transmissive-type OELD device according to a second embodiment of the present invention.

FIG. 5 is a schematic plan view of a partition wall for a transmissive-type OELD device according to a second embodiment of the present invention. As shown in FIG. 5, a partition wall 310 is formed in border portions between horizontally adjacent sub-pixels. The partition wall 310 only extends vertically and is not formed in border portions between vertically adjacent sub-pixels, which emit the same colored light. The partition wall 310 may be made of an insulating material having a high light transmittance, such as an organic insulating material. The partition wall 310 may be formed by the roll coating method, which coats partition walls on the substrate in a single direction to form patterns.

Figure 6:
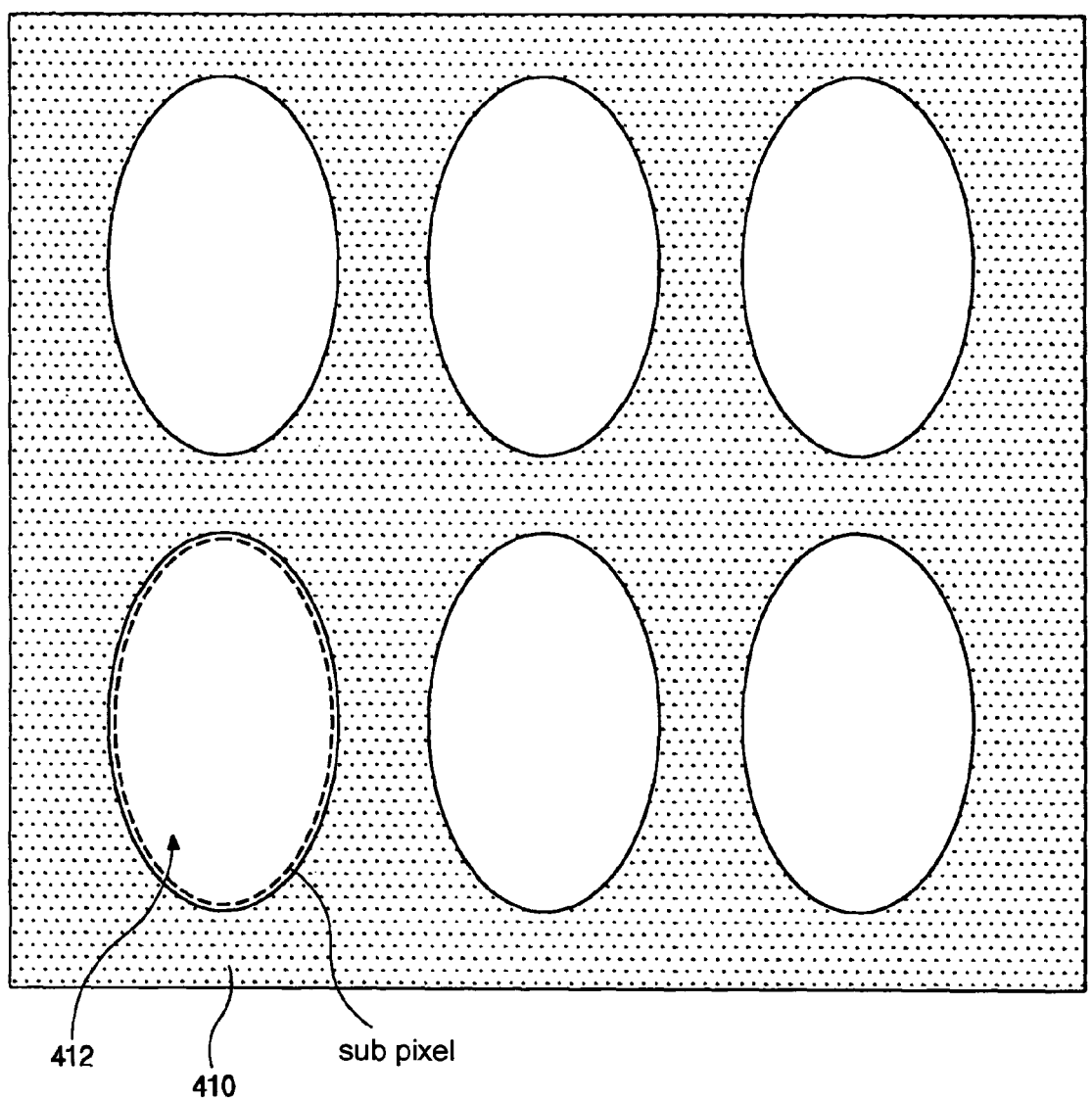
FIG. 6 is a schematic plan view of a partition wall for a transmissive-type OELD device according to a third embodiment of the present invention.

FIG. 6 is a schematic plan view of a partition wall for a transmissive-type OELD device according to a third embodiment of the present invention. As shown in FIG. 6, a partition wall 410 of the third embodiment forms circular openings 412 corresponding to sub-pixel regions. The partition wall 410 may be formed by the ink jet method, which forms patterns by using a dotting method. The partition wall 410 is made of an insulating material having a high light transmittance, such as an organic insulating material.

A transmissive-type OELD device can be used in a passive matrix-type OELD device, which does not include thin film transistors, and where sub-pixels are defined by electrodes crossing each other.

Figure 7:
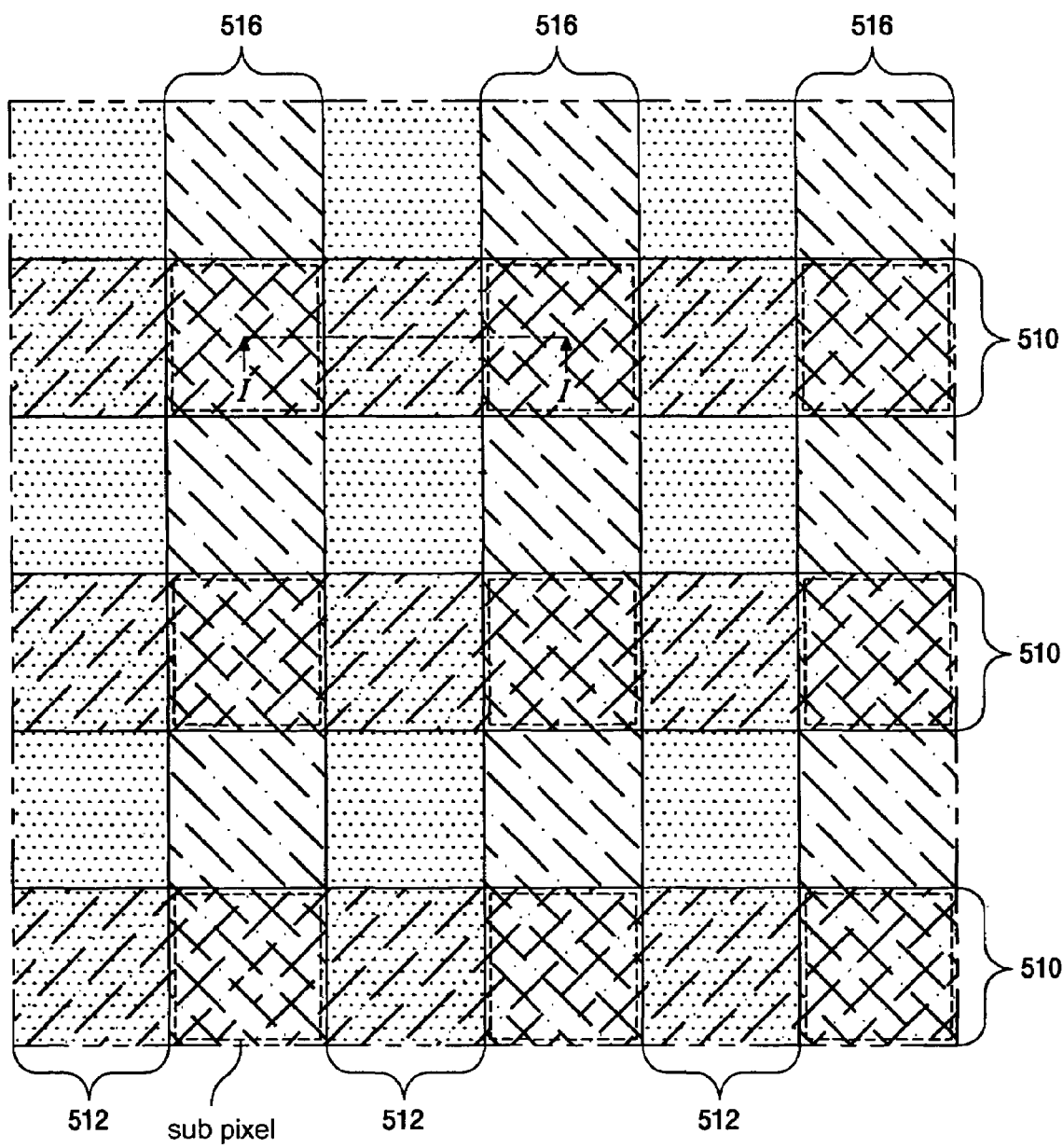
FIG. 7 is a schematic plan view of a passive matrix transmissive-type OELD device according to an embodiment of the present invention.

FIG. 7 is a schematic plan view of a passive matrix-type transmissive-type OELD device according to an embodiment of the present invention. As shown in FIG. 7, a plurality of first electrodes 510 is formed in a first direction. A plurality of partition walls 512 and a plurality of second electrodes 516 are formed in a second direction crossing the first direction with an alternating arrangement. The first and second electrodes 510 and 516 cross each other to define sub-pixel regions. The partition walls 512 may be made of an insulating material having a high transmittance, such as an organic insulating material. Although not shown in FIG. 7, a plurality of organic EL layers is formed under the second electrodes 516.

Figure 8:
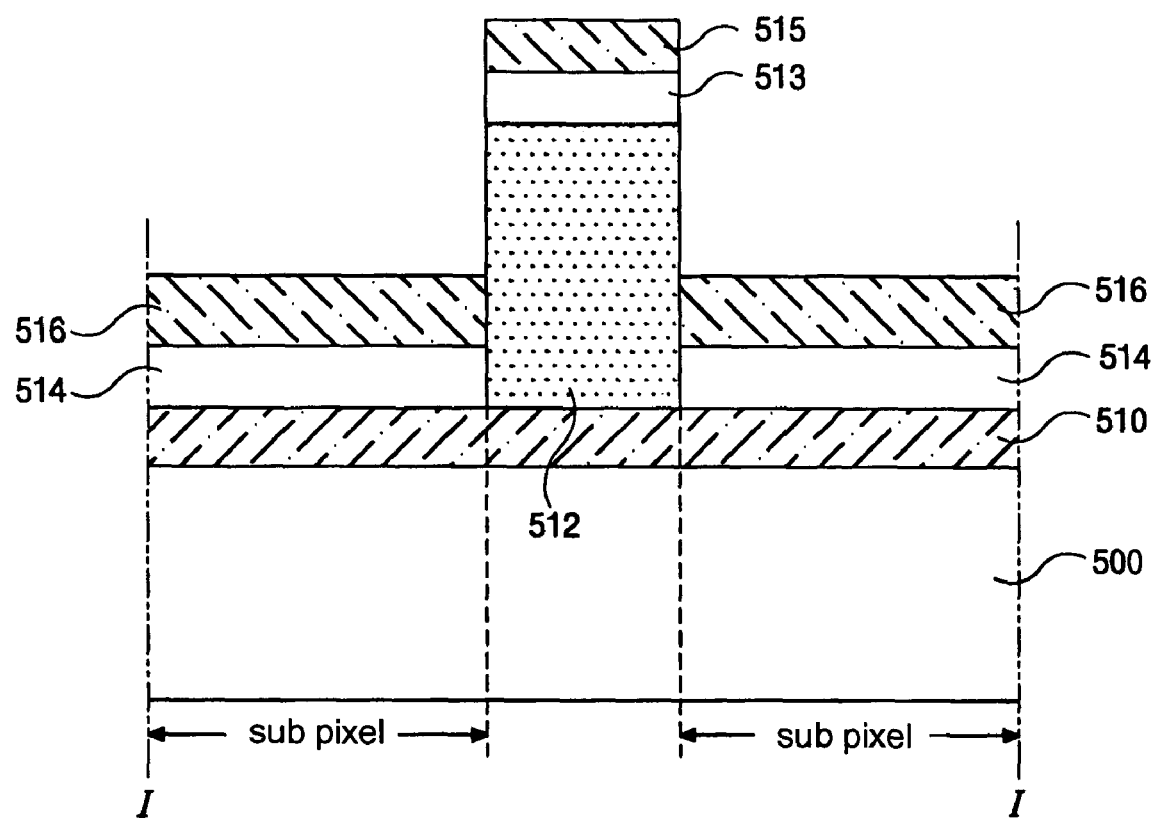
FIG. 8 is a schematic cross-sectional view taken along the line I—I in FIG. 7.

FIG. 8 is a schematic cross-sectional view taken along the line I—I in FIG. 7. As shown in FIG. 8, a first electrode 510 is formed on a substrate 500 including sub-pixel regions. A partition wall 512 is formed on the first electrode 510 at a border portion between adjacent sub-pixel regions. An organic EL layer 514 and a second electrode 516 are formed on the first electrode 510 between the partition walls 512. The organic EL layer 514 and the second electrode 516 are separated from the organic EL layer 514 and the second electrode 516 of the in adjacent sub-pixel region due to the partition wall 512 without a patterning process.

The partition wall 512 may have a thickness within a range of about 1 μm to about 8 μm. The organic EL layer 514 and the second electrode 516 may have thicknesses of about several thousands Å. Thus, the organic EL layer 514 and the second electrode 516 may be patterned using the partition wall 512 without an additional patterning process.

An area where the first electrode 510 and the second electrode 516 overlap each other forms a sub-pixel region and is defined as an emissive area, where light is emitted. The first and second electrodes 510 and 516 are made of a transparent conductive material. If the first electrode 510 acts as an anode electrode and the second electrode 516 serves as a cathode electrode, the second electrode 516 may further include a metallic thin film having low work function at an interface contacting the organic EL layer 514. Further, an organic EL material 513 and a second electrode material 515 may be sequentially formed on the partition wall 512, when the organic EL layer 514 and the second electrode 516 are formed.

FIG. 9 is a flow chart of a fabricating process of a transmissive-type organic electroluminescent display device according to embodiments of the present invention for an example of an active matrix-type OELD device. At step ST1, array elements that include thin film transistors are formed on a substrate. The thin film transistors are composed of a driving thin film transistor (TFT) that provides an organic electroluminescent (EL) diode with currents and a switching TFT that serves as a switching element. There may be a driving TFT and a switching TFT in each sub-pixel, or there may be a plurality of driving TFT and a plurality of switching TFT in each sub-pixel. The array elements also include a gate line, a data line, a power supply line, and a storage capacitor. The data line and the power supply line cross the gate line with an alternating arrangement to define a sub-pixel region.

At step ST2, a partition wall is formed in a border portion between adjacent sub-pixel regions on the array elements by using an insulating material having a high transmittance. The partition wall has a shape depending on a forming method of an organic EL layer. The partition wall may have a rectangular or circular opening. The partition wall may be formed in a single direction at border potions between adjacent sub-pixels, except for border portions between the same colored sub-pixels, for example.

At step ST3, a first electrode and an organic EL layer are sequentially formed in each sub-pixel on the substrate including the partition wall by using a first transparent conductive material and a high molecular material. The first electrode and the organic EL layer are patterned without a patterning process due to the partition wall. The organic EL layer may be formed by one of an ink jet method, a roll coating method and a nozzle coating method, for example.

The partition wall may have various shapes depending on the forming method of the organic EL layer. If the organic EL layer is formed by the ink jet method, the partition wall will preferably form an opening having a circular shape. In embodiments of the present invention, since the partition wall is made of a transparent material and the organic EL layer is formed of a high molecular material by an ink jet method, a roll coating method or a nozzle coating method, a large area transmissive-type OELD device having improved characteristics in transmitting light can be made.

At step ST4, a second electrode is formed on the entire surface of the substrate including the organic EL layer by using a second transparent metallic material. The second electrode preferably may be made of a transparent conductive material. For example, if the first electrode acts as an anode electrode and the second electrode serves as a cathode electrode, the second electrode may further include a thin film made of a metallic material having a low work function at an interface contacting the organic EL layer. The metallic material may be one of aluminum (Al), calcium (Ca), magnesium (Mg), lithium fluoride (LiF), and alkali metals.

At step ST5, the transmissive-type OELD device is encapsulated with a passivation layer. The passivation layer covers the second electrode. Before forming the passivation layer, a seal pattern may be formed at peripheral portions of the substrate, and then the substrate is encapsulated using the adhesive strength of the seal pattern. A desiccant may be further used to protect the organic EL layer from any moisture.

As described above, the transmissive-type OELD device according to embodiments of the present invention has the following advantages. First, the transmissive-type OELD device can be used in various applications due to the improved transmittance. Second, a large size transmissive-type OELD device can be manufactured. Third, the manufacturing process can be simplified.

It will be apparent to those skilled in the art that various modifications and variations can be made in the organic electroluminescent display device and the method of fabricating the organic electroluminescent display device of the present invention without departing from the spirit or scope of the inventions. Thus, it is intended that the present invention covers the modifications and variations of this invention provided they come within the scope of the appended claims and their equivalents.

What is claimed is:

1. A transmissive-type organic electroluminescent display device, comprising:
    a substrate including sub-pixel regions thereon;
    an array element in each sub-pixel area that includes thin film transistors;
    a partition wall at a border portion between adjacent sub-pixel regions made of a transparent insulating material;
    a first electrode made of a transparent conductive material in each sub-pixel region between adjacent partition walls, the transparent conductive material disposed on an upper surface of the partition wall;
    an organic electroluminescent layer on the first electrode in each sub-pixel region between the adjacent partition walls;
    a second electrode made of a transparent conductive material on the organic electroluminescent layer; and
    a passivation layer covering the second electrode,
    wherein the partition wall is provided with an organic electroluminescent material such that the organic electroluminescent material is formed on the partition wall and separate from the organic electroluminescent layer by the partition wall.

2. The device according to claim 1, wherein the organic electroluminescent layer is made of a high molecular material.

3. The device according to claim 1, wherein the partition wall forms an opening having a rectangular shape corresponding to the sub-pixel region.

4. The device according to claim 1, wherein the partition wall forms an opening having a circular shape corresponding to the sub-pixel region.

5. The device according to claim 4, wherein the organic electroluminescent layer is formed by an ink jet method.

6. The device according to claim 1, wherein the partition wall is formed only in a first direction at a border portion between adjacent sub-pixels.

7. The device according to claim 6, wherein the organic electroluminescent layer is formed by a roll coating method.

8. The device according to claim 1, wherein the organic electroluminescent layer is formed by one of an ink jet method, a roll coating method and a nozzle coating method.

9. The device according to claim 1, wherein the partition wall has a thickness within a range of about 1 µm to about 8 µm.

10. The device according to claim 1, wherein the partition wall is made of a transparent organic insulating material.

11. The device according to claim 1, wherein the first electrode is an anode electrode and the second electrode is a cathode electrode, wherein the second electrode includes a metallic thin film having a low work function contacting the organic electroluminescent layer.

12. The device according to claim 11, wherein the metallic thin film includes at least one of aluminum, calcium, magnesium, lithium fluoride and alkali metals.

13. The device according to claim 1, wherein the transparent conductive material for one of the first and second electrodes includes at least one selected from indium tin oxide, indium zinc oxide and indium tin zinc oxide.

14. A transmissive-type organic electroluminescent display device, comprising:
    a substrate including sub-pixel regions;
    a first electrode made of a first transparent conductive material;
    a partition wall made of a transparent insulating material at a border portion between adjacent sub-pixel regions, the partition wall including an upper surface having a portion of the first transparent conductive material;
    an organic electroluminescent layer in each sub-pixel region between adjacent partition walls; and
    a second electrode made of a second transparent conductive material on the organic electroluminescent layer between the adjacent partition walls,
    wherein the partition wall is provided with an organic electroluminescent material such that the organic electroluminescent material is formed on the partition wall and separate from the organic electroluminescent layer by the partition wall.

15. The device according to claim 14, wherein the first and second transparent conductive materials includes at least one of indium tin oxide, indium zinc oxide and indium tin zinc oxide.

16. A method of fabricating a transmissive-type organic electroluminescent device, comprising:
    forming array elements having thin film transistors in sub-pixel regions of a substrate;
    forming a partition wall at a border portion between adjacent sub-pixel regions, the partition wall being made of a transparent insulating material;
    forming a first electrode in each sub-pixel region between adjacent partition walls, the first electrode being made of a first transparent conductive material;
    forming an organic electroluminescent layer on the first electrode between the adjacent partition walls, the organic electroluminescent layer being made of a high molecular material;
    forming a second electrode on the entire substrate including the organic electroluminescent layer, the second electrode being made of a second transparent conductive material; and
    encapsulating the substrate including the second electrode by forming a passivation layer thereon,
    wherein an upper surface of the partition wall includes a portion of the first transparent conductive material and the high molecular material that is separate from the organic electroluminescent layer by the partition wall.

17. The method according to claim 16, wherein forming the organic electroluminescent layer includes using one of an ink jet method, a roll coating method and a nozzle coating method.

18. The method according to claim 16, wherein the transparent insulating material is an organic insulating material.

19. The method according to claim 16, wherein the first and second transparent conductive materials includes at least one of indium tin oxide, indium zinc oxide and indium tin zinc oxide.

* * * * *